United States Patent [19]

Santorelli

[11] Patent Number: 4,578,315

[45] Date of Patent: Mar. 25, 1986

[54] PHENOLIC RESINS, CARBOXYLIC RESINS AND THE ELASTOMERS CONTAINING ADHESIVE

[75] Inventor: Michael Santorelli, Schenectady, N.Y.

[73] Assignee: Schenectady Chemicals Inc., Schenectady, N.Y.

[21] Appl. No.: 766,019

[22] Filed: Aug. 15, 1985

Related U.S. Application Data

[62] Division of Ser. No. 701,205, Feb. 13, 1985.

[51] Int. Cl.$^4$ .............................................. B32B 27/38
[52] U.S. Cl. .................................. 428/414; 428/413; 428/416; 428/418; 428/423.1; 428/425.8; 428/460; 428/461; 428/462; 428/463; 428/473.5; 428/524; 428/901; 525/108; 525/109; 525/110

[58] Field of Search ............ 428/413, 414, 416, 425.8, 428/458, 460, 461, 462, 463, 473.5, 524, 901

[56] References Cited

U.S. PATENT DOCUMENTS

| | | | |
|---|---|---|---|
| 3,904,588 | 9/1975 | Greene | 260/78.5 R |
| 3,905,931 | 9/1975 | Ziegert | 525/108 X |
| 3,932,689 | 1/1976 | Watanabe | 428/418 |
| 4,323,659 | 4/1982 | Watanabe | 525/108 |

*Primary Examiner*—Theodore E. Pertilla
*Attorney, Agent, or Firm*—Cushman, Darby & Cushman

[57] ABSTRACT

An adhesive is disclosed for use in flexible circuitry, laminates and electrical products. The adhesive has improved flexibility and adhesive properties. It may be applied in solution form or may be cast as a free-standing film which is later heated and compressed to give adhesive properties. The adhesive comprises a phenol-aldehyde resin or other phenolic resin, an epoxy resin and an elastomer.

28 Claims, No Drawings

PHENOLIC RESINS, CARBOXYLIC RESINS AND THE ELASTOMERS CONTAINING ADHESIVE

This is a division of application Ser. No. 701,205, filed Feb. 13, 1985.

BACKGROUND OF THE INVENTION

Heretofore, thermosetting adhesives have exhibited serious deficiencies in bond strength and flexibility when used with certain substrates such as Kapton (polyimide) film, polysulfone film, copper foil, or nickel foil. Phenolic adhesives and epoxy-phenolic adhesives suffer from brittleness and poor adhesion making them unsuitable for use on flexible substrates. These deficiencies, coupled with adhesive failure when electrical components are soldered, preclude their usage in many applications.

The Watanabe U.S. Pat. No. 3,932,689 shows a composition containing a cresol formaldehyde resin, a bisphenol based epoxy compound, an acrylonitrile-butadiene copolymer and several other components. Watanabe U.S. Pat. No. 4,323,659 discloses several compositions containing a bisphenol type epoxy resin, an acrylic copolymer, an imidazole accelerator and a brominated novolak. These compositions however, do not include an ethylene acrylic elastomer.

An object of the invention is to provide an adhesive with the flexibility and adhesion necessary for use with the above mentioned substrates.

A further object of the invention is to provide a thermosetting adhesive with improved bond strength and improved ability to withstand the various manufacturing conditions necessary to produce flexible circuitry (e.g., high temperatures, soldering, or etching).

A further object of this invention is to provide an adhesive that may be applied to film in solution form, or may be cast as a free-standing film itself to be used as an adhesive in laminated form.

SUMMARY OF THE INVENTION

The present invention relates to an adhesive suitable for use in flexible circuitry and electrical products. The adhesive withstands high temperatures, soldering and etching. It has improved flexibility and adhesive properties. The adhesive may be applied in solution form or may be cast as a free-standing film which is later heated and compressed to give adhesive properties. The adhesive comprises a phenol-aldehyde resin, an epoxy resin, and an ethylene-acrylic elastomer.

The adhesive may be applied in solution form since it is in solvent, or may be cast as an free-standing film to be used as an adhesive in film form. The liquid adhesive can be used to adhere copper to processed laminates, or Kapton (polyimide) film to copper foil. After a heat treatment to effect curing, the adhesive composition exhibits high bond strength, solder resistance, temperature resistance, flexibility and excellent electrical properties. The adhesive works well in circuit board manufacture where flexible films must be bonded together to make board substrates which subsequently are wired and soldered.

DETAILED DESCRIPTION OF THE INVENTION

The adhesive composition of the present invention comprises or consists of a phenolic resin e.g. a phenol-aldehyde resin or cashew nut shell liquid polymer, an epoxy resin, and an elastomer. A catalyst can be added to promote reaction between the epoxy resin and the phenol-aldehyde resin. A co-elastomer may be used where certain specific performance is desired.

The phenol-aldehyde resin is formed by the reaction of phenol and/or substituted phenols with aldehydes. The phenol can have more than one hydroxy group (e.g. resorcinol), and can have hydrocarbon and other substituents. More than one substituent can be present. The aldehyde for example can be furfural or preferably formaldehyde. These phenol-aldehyde resins include thermoplastic resins (novolaks, two-step resins), heat reactive resins, and thermosetting resins (resole, one-step resins). These are formed by reactions of aldehydes with phenols at aldehyde to phenol mole ratios of 0.5 to 0.89 for novolaks and 0.85 to 2.0 for resoles. There can also be employed modified phenol-aldehyde resins.

The phenolic resin types employed were heat reactive resins, resoles and novolaks. These resins may be based for example on phenol, nonylphenol, o-cresol, p-cresol, cresylic acids, cashew nutshell liquid, o-ethylphenol, para-tert-butylphenol, octylphenol (e.g. p-octylphenol) or the allylether formed by etherifying the phenolic hydroxyl group of trimethylol phenol. These resins may be modified with 5 to 40% of epoxies, nitrile rubber, cashew nutshell liquid, zinc, tall oil, acrylics, phenoxies, or polyvinyl butyral.

The epoxy resin may be a bisphenol A-epichlorohydrin resin, hydantoin epoxy resin or an aliphatic glycidyl ether such as butylglycidyl ether or other epoxy resins such as those shown in U.S. Pat. No. 2,500,600, the entire disclosure of which is hereby incorporated by reference. The epoxy groups in hydantoin-epoxy are connected to the nitrogen atoms, e.g. by reaction with epichlorohydrin.

The elastomer which has been most successful in an ethylene acrylic elastomer such as Dupont's Vamac. Vamac is made in accordance with Greene U.S. Pat. No. 3,904,588 the entire disclosure of which is hereby incorporated as reference and relied upon. The ethylene acrylic elastomer according to Greene is a copolymer (terpolymer) of ethylene and methyl acrylate plus a cure site monomer $(-R-)_z-COOH$. The elastomers have the formula

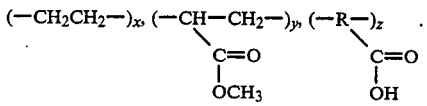

Thus there can be used a copolymer (terpolymer) of ethylene, methyl (or ethyl) acrylate, and about 0.5 to 10 weight percent of a mono alkyl ester of 1,4-butene-dioic acid in which the alkyl group of the ester has 1 to 6 carbon atoms, and the copolymer has about 20 to 35 grams of $(-CO_2-)$ units per 100 grams of copolymer; the copolymer having a melt index of 0.3 to 100 g/10 minutes. For example the copolymers can contain 40–62 weight percent of methyl acrylate units. Examples of mono alkyl esters are: propyl hydrogen maleate, ethyl hydrogen maleate, and methyl hydrogen maleate.

In place of Vamac in the working examples of this specification (see below) there can be used in the same amount the terpolymer of ethylene, methyl acrylate and ethyl hydrogen maleate, e.g., the terpolymer of Examples 2 or 5 of the Greene patent.

Acrylic elastomers such as Hycar 4051 made from various combinations acrylic acid, acrylate-esters and acrylamide, have also been used.

Nitrile rubber can be used as an elastomer, such as B. F. Goodrich's Hycar 1032 (33% acrylonitrile) and reactive liquid polymers such as carboxyl-terminated polybutadiene (Hycar CTB), or carboxyl-terminated polybutadiene containing acrylonitrile (Hycar CTBN with 10%, 18% or 26% bound acrylonitrile and Hycar CTBNX (contains 18% bound acrylonitrile and additional random carboxyl groups)). The properties of these compositions are as follows:

| Polymer Characterization | Hycar CTB 2000X156 | Hycar CTBN (1300X8) | Hycar CTBNX (1300X9) |
|---|---|---|---|
| Viscosity @ 27° C. Brookfield RVT #7 20 rpm, cps | 35,000 | 110,000 | 125,000 |
| EPHR - Carboxyl | 0.042 | 0.053 | 0.065 |
| Percent - Carboxyl | 1.9 | 2.37 | 2.93 |
| Molecular Weight Number Average | 4000 | 3200 | 3400 |
| Carboxyl Functionality | 2.01 | 1.8 | 2.4 |
| Specific Gravity at 20°/25° C. | 0.9069 | 0.9483 | 0.9554 |
| Refractive Index at 25° C. | 1.5145 | 1.5142 | 1.5141 |
| Heat Loss - 2 Hrs. @ 130° C. - % | 0.5 | 1.0 | 1.0 |
| Unsaturation as: | | | |
| cis - % | 22.1 | 23.8 | 16.3 |
| trans - % | 53.4 | 64.2 | 68.7 |
| vinyl - % | 24.5 | 12.0 | 15.0 |
| Bound Acrylonitrile, % | — | 18–19 | 18–19 |
| Ash - % | 0.02 | — | — |

Vinyl-terminated polybutadiene containing acrylonitrile (Hycar VTBN (16% acrylonitrile and Hycar VTBNX (containing 16% bound acrylonitrile and additional random vinyl groups)) having the structure

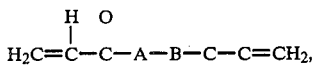

where A is 1,4- or 1,2-butadiene and B is acrylonitrile, or hydroxy-terminated polybutadiene containing acrylonitrile (Hycar HTBN containing 10% or 17% bound acrylonitrile), may also be used as elastomers. The Hycar polymers can be substituted or unsubstituted.

Other elastomers tested were DuPont's Viton which is a fluoroelastomer based on the copolymer of vinylidene fluoride and hexafluoropropylene with the repeating structure possibly —$CF_2$—$CH_2$—$CF_2$—$CF(CF_3)$—; DuPont's Adiprene which is a polyurethane rubber, the reaction product of diisocyanate and polyalkylene etherglycol; DuPont's Hypalon, a chlorosulfonated polyethylene which is a synthetic rubber; Borg Warner's Blendex, a synthetic resinous product; and Arco's Poly B-D which is a low molecular weight liquid polymer based on butadiene containing controlled hydroxyl functionality (homo-and copolymers).

The Vamac and Hycar elastomers proved to be the most successful. The others failed to form unsupported films or to offer any advantage in adhesive properties over conventional adhesives. In applications where specific properties are desired, two or more elastomers may be used. The coelastomer ranges from 0 to 25% of the ethylene acrylic elastomer level, or from 0 to 20% of the final solids content of the composition.

A catalyst can be added to this system. This catalyst can be one which promotes the reaction of the epoxy resin and the phenol-aldehyde resin. A catalyst used with a nitrile-based elastomer can be one which promotes vulcanization of the elastomer. On occasion it can be desirable to use more than one catalyst.

The catalyst and curing agents include for example 2-methyl imidazole, tetraisopropyl titanate, trimellitic anhydride, pyromellitic dianhydride, Mondur S, Mondur SH, sulfur, mercaptobenzothiazole, tetramethyl thiuramdisulfide, di-ortho-tolylguanidine, N-oxydiethylene benzothiazole-2-sulfenamide, benzothiazyl disulfide. At present imidazole catalysts are preferred. Additional suitable imidazole catalysts are those mentioned in Watanabe U.S. Pat. No. 4,313,654, col. 4, lines 45–61.

The adhesive composition is prepared by combining the phenol-aldehyde resin (or other phenolic resin), epoxy resin and elastomer in solution. This may be done by putting each component in solvent and mixing the three solutions together, or by a general mixing of components and solvents until a solution is reached.

The ratio of epoxy resin to phenol-aldehyde resin may be from 20 parts epoxy to 80 parts phenol-aldehyde, to 80 parts epoxy to 20 parts phenol-aldehyde. The elastomer may be from 10% to 80% of the final solids material. Optimum results are obtained when the epoxy to phenol-aldehyde ratio is 30/70 to 50/50, respectively, and the elastomer is 40% to 60% of the final solids.

The adhesive of the present invention can also be used to produce an unsupported film. This film may be formed by coating the adhesive on a release medium, drying, and then rolling the film with or without the release medium. The adhesive may be coated on a substrate, dried, and then stored on the substrate for future use. The film is later heated and compressed to give adhesive properties. This permits use of this material in applications where a solvent should not be used.

The composition can comprise, consist essentially of or consist of the stated materials. Unless otherwise indicated all parts and percentages are by weight.

EXAMPLES

The following examples illustrate the invention in more detail. In each of the examples, the solids content of the composition was 35% in methyl ethyl ketone. The composition was coated on 200H Kapton film (polyimide film) at a dry film thickness of 0.001 inch. The coated samples were dried in an air circulating oven at 100° C. for 10 minutes. The samples were then laminated to 1 oz. RATK copper foil by pressing and roll lamination. The press procedure was as follows: begin with a press @ 350° F., place samples in at 400 psi, hold at temperature and pressure for one (1) hour, and then cool rapidly to ambient temperature. The samples for roll lamination were made at 4 FPM, 400 psi at 350° F.

These prepared samples were tested for bond strength at ambient temperature, bond strength after solder exposure of 550° F., and dielectric strength.

Example #1

Phenol was reacted with formaldehyde at an F/P mole ratio of 0.64 with oxalic acid as a catalyst. A 116°–120° (Ball & Ring) meltpoint resin was produced.

This resin was placed into solution with a brominated epichlorohydrin-bisphenol A epoxy (Epirez 5183). The weight ratio of phenolic to epoxy was 50/50. This material was then blended with an ethylene acrylic elastomer (Vamac) and Hycar CTBN-1300×13 (26% bound acrylonitrile). The final composition was 22.75% epoxy, 22.75% phenol-aldehyde, 45.5% elastomer (Vamac) and 9% coelastomer (Hycar) by weight. This material was reduced to 35% solids in solvent. The catalyst 2-methyl-imidazole was added (0.22% based on solids).

Example #2

Meta-cresol was reacted with formaldehyde at an F/P mole ratio of 0.887 with an oxalic acid catalyst. This resulted in a 190° C. (Ball & Ring) meltpoint resin. This resin was blended with butyl glycidyl ether, Vamac and Hycar CTBN. The ratios were identical to Example #1. The solvent and catalyst levels were identical to Example #1.

Example #3

The resin of Example #2 was blended with Epirez 5183, Vamac and Hycar CTBN. The ratios were 18.2% phenol-aldehyde, 18.2% epoxy, 54.5% Vamac and 9.1% Hycar. The solids content was identical to Example #1 but the catalyst was omitted.

Example #4

The resin of Example #2 was blended with glycidyl methacrylate, Vamac and Hycar CTBN. The ratios, solvent levels and catalysts were identical to Example #1.

The Table 1 reports the test data on Examples 1 to 4. The values in the column labeled "control" were obtained using a standard adhesive system based on epoxy resin. The results were obtained by using IPC Method 2.4.9, and the SCI Method (described below). Table 2 shows bond strength data as an additional series of adhesives obtained using the SCI Method. The data in Table 2 is included to indicate the added scope of the invention in employing other types of resins.

SCI Method For Testing Fiber Adhesive Laminate Strips

Liquid adhesive was applied on 0.002-in. Kapton Type H polyimide film, by drawing 5×10-in. film strip containing excessive adhesive through stainless steel rolls. Roll separation was adjusted in order to give an adhesive thickness of 0.0015-0.0020 in. following exposure of the adhesive-coated film in an oven at 105° C. for 10 min. Approximately 1 to 2 in. of one of the 5-in. edges was left uncoated to provide a gripping surface for the pull testing. After removal from the oven, the adhesive-coated film was checked for tackiness by touch, and for bubbles by visual inspection. Bond strength was determined as follows: copper foil (1 oz.) was cut into 5×10-in. pieces approximating the size of the coated film strips. The adhesive-containing face of the film strip was mated to the copper foil. A temporary bond was achieved by touching two opposite edges of the film with a hot spatula sufficient to soften the adhesive and achieve bonding.

The foil-film laminates were permanently bonded in an EEMCO press (hydraulic with electric heat, 75 ton capacity, platen size 18×18 in.) as follows. Approximately 40 sheets of 14×14×0.0065-in. Kraft paper forming a bed approximately ¼ in. thick, were placed on the polished side of a 14×14×⅛-in. stainless steel panel. On top of the Kraft paper two 5×10-in. foil-film laminates were placed side by side. On top of the laminates was placed another ¼-in. layer of Kraft paper sheets, followed by the polished side of the second 14×14×⅛-in. stainless steel panel. This composite was placed in the pre-heated EEMCO press at 350° F. and held for 30 min. at 450 psi.

After removal from the press, and after cooling for 15-20 min., the 5×10-in. foil-film laminates were cut into four 1×8-in. strips for testing. The unbonded 1-2-in. margins at one end of the strips were coated with masking tape for gripping in an Instron tester (Model TT-C floor model with 10,000 lb. capacity and 20-lb., full-scale range). A "T" pull method was employed using a Model 3CA pneumatic-action clamp at a cross-head speed of 2 in./min. and a chart speed of ½ in./min. Results were recorded in lbs./linear in. Specimens were visually examined for adhesive and cohesive failure.

It is believed that the results obtained using the IPC Method are a truer reflection of the actual bond strength than the results obtained by the SCI Method. As shown in Table 1, the IPC Method results are approximately 160-165% of the values obtained using the SCI Method on the same composition. If the SCI bond strength values in Table 2 are multiplied by a factor of 1.6 then most of the values are approximately equal to the control value bond strength of 5-7 pounds/inch.

| Test | Method Used | Units | #1 | #2 | #3 | #4 | Control |
| --- | --- | --- | --- | --- | --- | --- | --- |
| Bond Strength Roll Laminate | IPC TM650-2.4.9. IPC Method A | Lbs./In. | 8-9 | 7-8 | 7-9 | 4-6 | |
| | 550° F. Solder IPC Method C | Lbs./In. | 8-10 | 10-12 | 9-10 | Blistered | |
| Bond Strength Press Laminate | IPC TM650-2.4.9. IPC Method A | Lbs./In. | 10-11 | 8-10 | 9-10 | 8-9 | 5-7 |
| | SCI Method | Lbs./In. | 6.35 | 4.73 | 6.30 | 6.25 | |
| | 550° F. Solder IPC Method C | Lbs./In. | 8-10 | 10-12 | 9-10 | Blistered | 8-9 |
| Dielectric Strength | ASTM-D-149 | KV/Mil. | 3-4 | 3-5 | 3-2 | 3-7 | |

| Resin Type | Melting Pt. Physicals | SCI Method Bond Strength Lbs./In. | Bond Strength × 1.6 Lbs./In. | IPC Method Lbs./In. |
| --- | --- | --- | --- | --- |
| Para-tert-octylphenol | 85° C. | 5.65 | 9.04 | |
| Para-tert-butylphenol | 83° C. | 5.53 | 8.85 | |

| Resin Type | Melting Pt. Physicals | SCI Method Bond Strength Lbs./In. | Bond Strength × 1.6 Lbs./In. | IPC Method Lbs/In. |
|---|---|---|---|---|
| Phenol Novolak | 116–120 | 6.66 | 10.66 | 10–11 |
| Cashew Nutshell Oil, Phenol Novalak | 90–110° C. | 6.60 | 10.56 | |
| Nonylphenol Novolak | 97–101° C. | 5.9 | 9.44 | |
| Tall Oil, Phenol Novolak | 90–100° C. | 5.2 | 8.32 | |
| O-Cresol Novolak | 99–104° C. | 4.51 | 7.22 | |
| M-cresol, P-Cresol, O—Ethylphenol, Novolak | 150–165° C. | 4.78 | 7.65 | |
| Blendex BTA,* Phenol Novolak | 100–105° C. | 3.93 | 6.29 | |
| Cresylic Acid Resole | 78–88° C. | 3.25 | 5.20 | |
| Furfural-Phenol Novolak | 100–105° C. | 3.43 | 5.49 | |
| Acrylic-Modified Phenol Novolak | 105–110° C. | 4.59 | 7.34 | |
| Phenoxy-Modified Phenol Novolak | 105–110° C. | 3.51 | 5.62 | |
| Cashew Nutshell Oil Polymer | — | 4.56 | 7.30 | |
| Resorcinol Novolak | 100–110° C. | 5.63 | 9.01 | |
| M-Cresol Novolak | 195° C. | 6.20 | 9.92 | |
| Methylon Resin | — | 4.0 | 6.40 | |
| Phenoxy PKHH | — | 5.10 | 8.16 | |

*Blendex BTA is a thermoplastic copolymer of methacrylate/acrylonitrile/styrene
For each of the resin types tested in Table 2 the following characteristics were constant:
Resin Wt. Ratio: 22.75%
Epoxy Type: Epirez 5183
Epoxy Wt. Ratio: 22.75%
Elastomer: Vamac C
Elastomer Wt. Ratio: 45.5%
Co-Elastomer: Hycar CTBN
Co-Elastomer Wt. Ratio: 9%
Catalyst: 2-methyl imidizole
Catalyst Wt. Ratio: 0.22%
The phenol - and substituted-phenol-containing resins in Table 2 contain solely a phenol reacted with formaldehyde except for the furfural-phenol novolak, the cashew nutshell oil copolymer, cashew nutshell oil polymer and the modified phenolic novolaks.

What is claimed is:

1. A laminate of copper and a polyimide film bonded by an adhesive composition comprising:
   (a) 4–72% by weight phenol-aldehyde resins or a resin of an ethylenically unsaturated phenol;
   (b) 4–72% by weight 1,2-epoxy resin;
   (c) 10–80% by weight of an ethylene acrylic elastomer; wherein the ratio of phenol aldehyde to 1,2-epoxy resin is from 1:4 to 4:1.

2. A laminate according to claim 1 wherein (a) is a phenol-aldehyde resin.

3. The laminate according to claim 1 wherein the phenol aldehyde resin is an alkylphenol-formaldehyde resin.

4. The laminate according to claim 2 wherein the isphenol-aldehyde phenol per se or cresol formaldehyde resin.

5. The laminate of claim 1 wherein the 1,2-epoxy resin is bisphenol A-epichlorohydrin, hydantoin epoxy, or an aliphatic glycidyl ether.

6. The laminate of claim 1 wherein the ethylene acrylic elastomer is a copolymer of ethylene, methyl or ethyl acrylate and a cure site of the formula $R_1OOC-C=C-COON$ where $R_1$ is an alkyl group of 1 to 6 carbon atoms.

7. The laminate of claim 6 wherein the elastomer contains 0.5 to 10 weight percent of the cure site monomer units and 40 to 62 weight % of methyl or ethyl acrylate units.

8. The laminate of claim 1 wherein the adhesive composition includes a catalyst promoting the reaction of the phenol-aldehyde and the 1,2-epoxy resin.

9. The laminate of claim 8 wherein the catalyst is an imidazole.

10. A laminate according to claim 1 wherein a portion of the ethylene-acrylic elastomer is replaced by a nitrile-based elastomer and wherein not over 25% of the ethylene-acrylic elastomer is replaced by the nitrile based elastomer.

11. The laminate according to claim 1 wherein the adhesive composition comprises:
   (a) 4–72% by weight phenol aldehyde or a resin from an unsaturated phenol;
   (b) 4–72% by weight 1,2-epoxy resin;
   (c) 10–80% by weight of a copolymer and ethylene, an alkyl acrylate selected from methyl and ethyl acrylate, and from about 0.5 to 10 weight percent of a mono alkyl ester of 1,4-butenne-dioic acid in which the alkyl group of the ester has 1 to 6 carbon atoms, said copolymer having from about 20 to 35 grams of ($-CO_2-$) units per 100 grams of copolymer, said copolymer having a melt index of about 0.3 to 100 g/10 min.

12. The laminate of claim 11 wherein said mono alkyl ester of 1,4-butene dioic acid is: methyl hydrogen maleate, ethyl hydrogen maleate, or propyl hydrogen maleate.

13. The laminate of claim 12 wherein the alkyl acrylate units comprise about 40 to 62% weight percent of the copolymer.

14. The laminate of claim 11 wherein (a) is a phenol-formaldehyde or cresol-formaldehyde resin.

15. A circuit board comprising films bonded together by an adhesive composition comprising:
   (a) 4–72% by weight phenol-aldehyde resin or a resin of an ethylenically unsaturated phenol;
   (b) 4–72% by weight 1,2-epoxy resin;

(c) 10–8% by weight of an ethylene acrylic elastomer; wherein the ratio of phenol-aldehyde to 1,2-epoxy resin is from 1:4 to 4:1.

16. A circuit board according to claim 15 wherein (a) is a phenol-aldehyde resin.

17. The circuit board according to claim 15 wherein the phenol aldehyde resin is an alkylphenol-formaldehyde resin.

18. The circuit board according to claim 16 wherein the phenol-aldehyde is phenol per se or cresol formaldehyde resin.

19. The circuit board according to claim 15 wherein the 1,2-epoxy resin is bisphenol A-epichlorohydrin, hydantoin epoxy, or an aliphatic glycidyl ether.

20. The circuit board of claim 15 wherein the ethylene-acrylic elastomer is a copolymer of ethylene, methyl or ethyl acrylate and a cure site of the formula $R_1OOC-C=C-COOH$ where $R_1$ is an alkyl group of 1 to 6 carbon atoms.

21. The circuit board of claim 20 wherein the elastomer contains 0.5 to 10 weight percent of the cure site monomer units and 40 to 62 weight % of methyl or ethyl acrylate units.

22. The circuit board of claim 15 wherein the adhesive composition includes a catalyst promoting the reaction of the phenol-aldehyde and the 1,2-epoxy resin.

23. The circuit board of claim 20 where the catalyst is an imidazole.

24. The circuit board according to claim 15 wherein a portion of the ethylene-acrylic elastomer is replaced by a nitrile-based elastomer and wherein not over 25% of the ethylene-acrylic elastomer is replaced by the nitrile based elastomer.

25. The circuit board according to claim 15 wherein the adhesive composition comprises:
   (a) 4–72% by weight phenol aldehyde or a resin from an unsaturated phenol;
   (b) 4–72% by weight 1,2-epoxy resin;
   (c) 10–80% by weight of a copolymer of ethylene, an alkyl acrylate selected from methyl and ethyl acrylate, and from about 0.5 to 10 weight percent of a mono alkyl ester of 1,4-butene-diodic acid in which the alkyl group of the ester has 1 to 6 carbon atoms, said copolymer having from about 20 to 35 grams of ($-CO_2-$) units per 100 grams of copolymer, said copolymer having a melt index of about 0.3 to 100 g/10 min.

26. The circuit board of claim 25 wherein said mono alkyl ester of 1,4-butene dioic acid is: methyl hydrogen maleate, ethyl hydrogen maleate, or propyl hydrogen maleate.

27. The circuit board of claim 26 wherein the alkyl acrylate units comprise about 40 to 62% weight percent of the copolymer.

28. The circuit board of claim 25 wherein (a) is a phenol-formaldehyde or cresol-formaldehyde resin.

* * * * *

UNITED STATES PATENT AND TRADEMARK OFFICE
CERTIFICATE OF CORRECTION

PATENT NO. : 4,578,315
DATED : Mar. 25, 1986
INVENTOR(S) : Michael Santorelli

It is certified that error appears in the above-identified patent and that said Letters Patent is hereby corrected as shown below:

Column 2, line 37, change "in" to --is--.
Column 3, line 2, insert --of-- after "combinations";
lines 41-45, correct the formula to read:

Column 4, line 17, change "4,313,654" to --4,323,659--.
Column 7, fourth line from bottom of chart, change "imidizole" to --imidazole--.

Column 7, claim 6, line 4, change "COON" to --COOH--.
Column 8, claim 11, line 9, change "butenne" to --butene--.
Column 10, claim 25, line 9, change "diodic" to --dioic--;
claim 26, line 2, change "butene dioic" to --butene-dioic--.

Signed and Sealed this

Seventh Day of October, 1986

[SEAL]

Attest:

DONALD J. QUIGG

Attesting Officer

Commissioner of Patents and Trademarks